United States Patent
Jur

(10) Patent No.: US 9,972,468 B2
(45) Date of Patent: May 15, 2018

(54) INFORMATION TECHNOLOGY RACKS HAVING INTEGRATED BUS PLUGS AND RELATED SYSTEMS AND BUSWAYS

(71) Applicant: Eaton Intelligent Power Limited, Dublin (IE)

(72) Inventor: Arthur James Jur, Cleveland, TN (US)

(73) Assignee: Eaton Intelligent Power Limited, Dublin (IE)

(*) Notice: Subject to any disclaimer, the term of this patent is extended or adjusted under 35 U.S.C. 154(b) by 0 days. days.

(21) Appl. No.: 14/740,540

(22) Filed: Jun. 16, 2015

(65) Prior Publication Data
US 2016/0372879 A1    Dec. 22, 2016

(51) Int. Cl.
| | |
|---|---|
| H01R 4/60 | (2006.01) |
| H05K 7/00 | (2006.01) |
| H01H 71/02 | (2006.01) |
| H01H 71/10 | (2006.01) |
| H01R 25/16 | (2006.01) |
| H05K 7/14 | (2006.01) |

(52) U.S. Cl.
CPC .......... H01H 71/02 (2013.01); H01H 71/10 (2013.01); H01R 25/164 (2013.01); H05K 7/1492 (2013.01)

(58) Field of Classification Search
CPC .... H01R 25/145; H01R 31/085; H01R 25/14; H01R 9/2608
USPC .............. 361/729, 775; 439/211, 296, 297
See application file for complete search history.

(56) References Cited

U.S. PATENT DOCUMENTS

| | | | | |
|---|---|---|---|---|
| 5,196,987 A | * | 3/1993 | Webber | H01R 25/16 361/624 |
| 6,831,832 B2 | * | 12/2004 | Haager | H05K 7/1461 361/679.35 |
| 7,225,276 B2 | * | 5/2007 | Garnett | G06F 1/183 361/728 |
| 7,614,895 B2 | | 11/2009 | Jur et al. | |
| 7,918,678 B2 | * | 4/2011 | Cole | H01R 13/635 439/328 |
| 8,094,436 B2 | | 1/2012 | Mills et al. | |
| 8,879,241 B2 | * | 11/2014 | Lu | G06F 1/181 174/149 B |
| 8,901,416 B2 | * | 12/2014 | Bornhorst | H04B 3/54 174/34 |
| 9,417,664 B1 | * | 8/2016 | Dailey | H05K 7/1492 |

(Continued)

OTHER PUBLICATIONS

"Pow-R-Flex low ampere busway sets the standard for overhead power distribution systems of rmission-critical data center designs," Technical Data TD01701003E, Eaton Corporation, Jun. 2013, 31 pages.

*Primary Examiner* — Abdullah Riyami
*Assistant Examiner* — Thang Nguyen
(74) *Attorney, Agent, or Firm* — Myers Bigel, P.A.

(57) ABSTRACT

Busways and Information technology enclosures and related systems are provided. A busway for power distribution to equipment positioned in an information technology (IT) rack is provided, the busway including a plurality of openings on a first surface of the busway configured to receive a plurality of plug-in stabs associated with a plurality of bus plugs integrated with the IT rack, such that when the plurality of plug-in stabs are positioned in the plurality of openings in the busway, the IT rack is substantially flush with the first surface of the busway.

18 Claims, 5 Drawing Sheets

(56) References Cited

U.S. PATENT DOCUMENTS

| | | | |
|---|---|---|---|
| 9,450,357 B2* | 9/2016 | Kim | H01R 25/003 |
| 2007/0217125 A1* | 9/2007 | Johnson | H02J 9/062 361/600 |
| 2010/0075533 A1* | 3/2010 | Weaver | H01R 4/2404 439/532 |
| 2010/0221941 A1* | 9/2010 | Andersen | H01R 13/112 439/251 |
| 2011/0141665 A1* | 6/2011 | Fontana | H02B 1/20 361/601 |
| 2013/0201608 A1* | 8/2013 | Mills | H02B 1/056 361/636 |

* cited by examiner

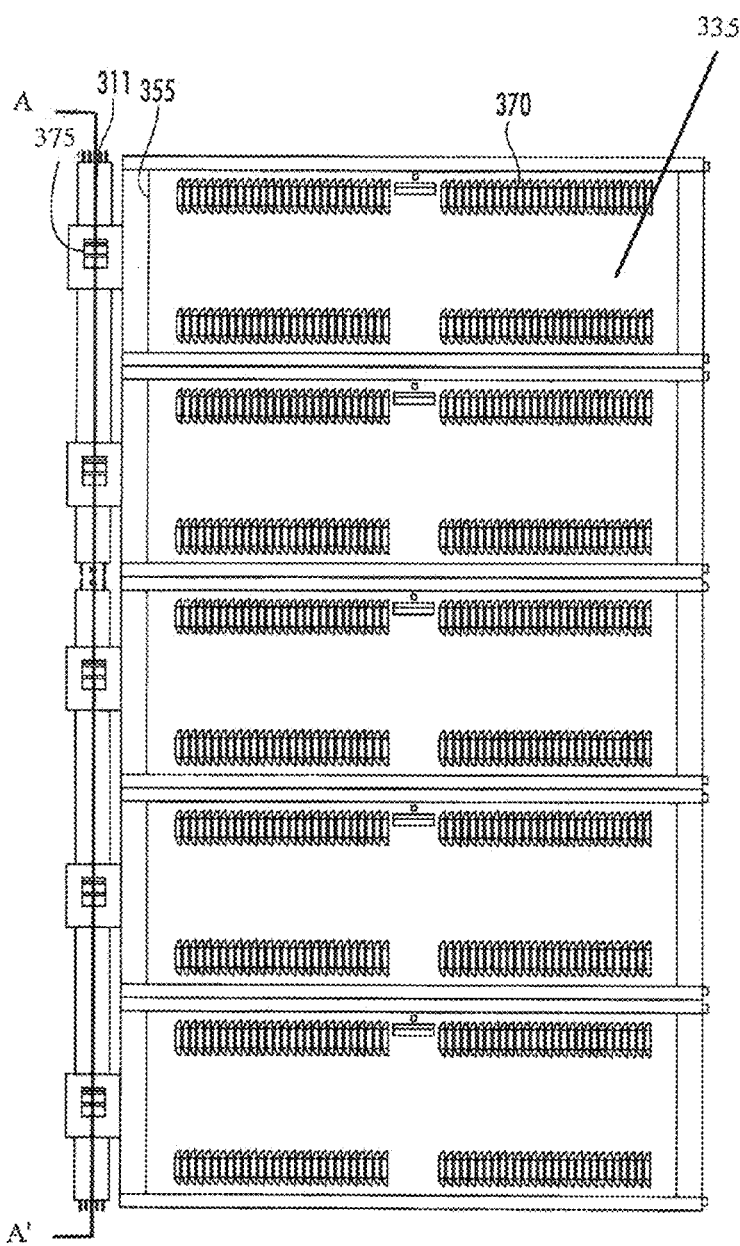
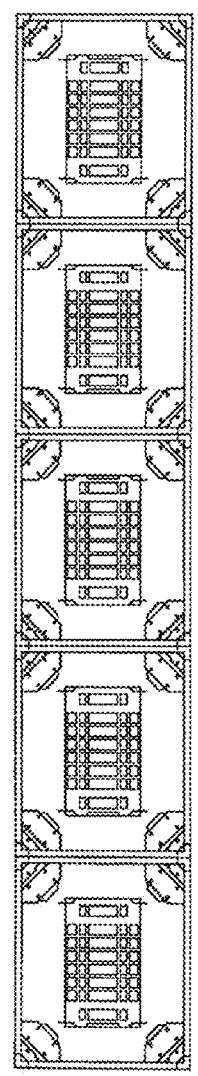
FIG. 3A
FIG. 3B

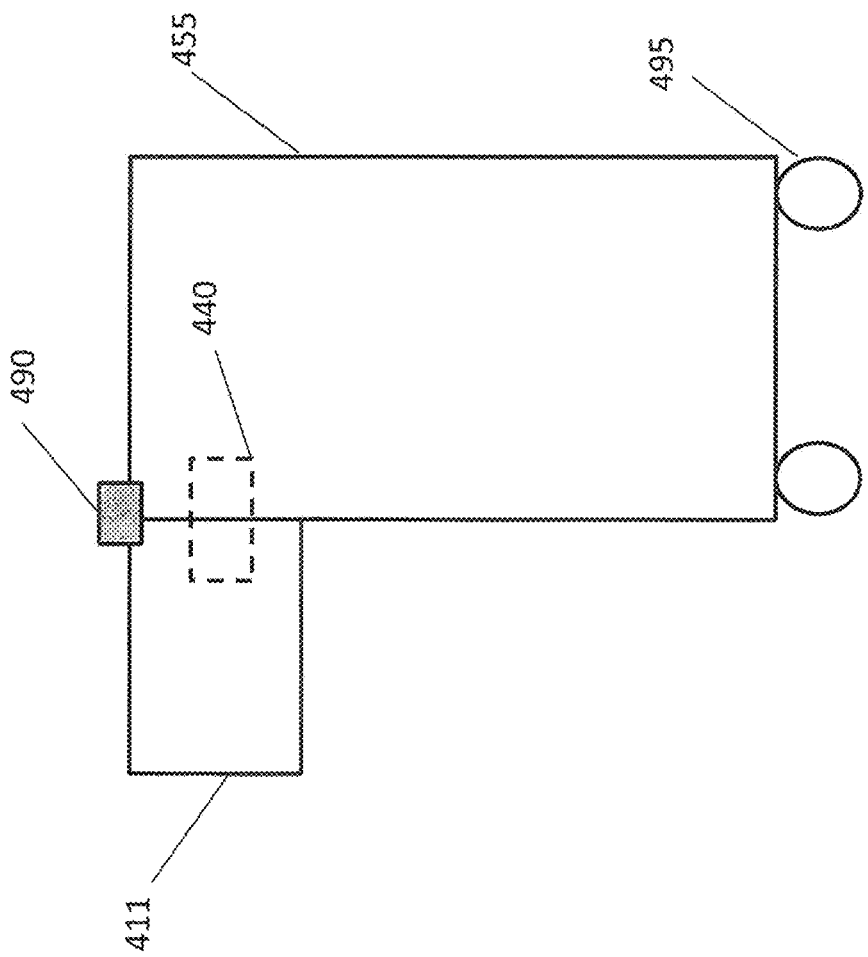

US 9,972,468 B2

INFORMATION TECHNOLOGY RACKS HAVING INTEGRATED BUS PLUGS AND RELATED SYSTEMS AND BUSWAYS

FIELD

The inventive concept generally relates to information technology (IT) racks and, more particularly, to IT racks and related busways.

BACKGROUND

Information technology (IT) racks with provision to mount electronic chassis are commonly used in telecommunications and computer networking applications. A typical data center, for example, may include multiple racks in which equipment chassis, e.g., servers, storage units, power supplies, and the like, are inserted and mounted. Power may be provided to the equipment installed in the racks by many available means. However, more recently busways are being used to distribute power to the equipment in the racks. As illustrated in FIG. 1, busways 105 typically run above (shown) or below a row of IT racks 115 (top of rack is visible) and may be mounted to the ceiling using, for example, brackets 110. The busways 105 may be configured to receive a plurality of bus plugs that include either a breaker or a switch. The bus plugs are configured to connect to the equipment in the IT racks and provide power from the busway. Typically, a receptacle 125 mounted on a cord 120 or fixed to the side of the bus plug is connected to a corresponding cord from equipment in the IT rack. As illustrated in FIG. 1, these cords and receptacles take up a lot of space and can be cumbersome. Furthermore, the cords and receptacles may be difficult to install and typically cost more than the remaining portion of the bus plugs.

SUMMARY

Some embodiments of the inventive concept provide a busway for power distribution to equipment positioned in an information technology (IT) rack, the busway including a plurality of openings on a first surface of the busway configured to receive a plurality of plug-in stabs associated with a plurality of bus plugs integrated with the IT rack, such that when the plurality of plug-in stabs are positioned in the plurality of openings in the busway, the IT rack is substantially flush with the first surface of the busway.

In further embodiments, when the plurality of plug-in stabs are positioned in the plurality of openings in the busway no cords or receptacles are used to connect the busway to the bus plugs integrated with the IT rack.

In still further embodiments, a spacing between the plurality of openings on the busway may be relative to a width of the IT rack.

In some embodiments, the plurality of plug-in stabs may be configured to be received by the plurality of openings protrude from a portion of the IT rack. The portion of the IT rack may be one of a back portion of the rack, a side portion of the rack and a top of the rack.

In further embodiments, the busway and the rack may be held flush using one or more clamps.

In still further embodiments, the IT rack may be a mobile IT rack and may be configured to be moved into a position to connect the bus plugs to the plug in stabs on the busway. The mobile IT rack may have wheels that enable the IT rack to be moved.

In some embodiments, the bus plugs may be mounted on an inside or an outside surface of the rack and the bus plugs may include one of a breaker/switch to electrically disconnect the bus plug from the busway. The breaker/switch may be positioned to be accessible to a technician to disconnect the power.

Further embodiments of the present inventive concept provide an information technology (IT) enclosure configured to be positioned in an IT rack, the IT enclosure includes an integrated plug-in stab associated with a bus plug, the plug in stab configured to be received in an opening on a first surface of a busway such that when the plug-in stab is positioned in the opening in the busway, the IT rack is substantially flush with the first surface of the busway.

In still further embodiments, when the plug-in stab is positioned in the opening in the busway no cords or receptacles are used to connect the busway to the bus plug integrated with the IT rack.

In some embodiments, the plug-in stab configured to be received by the opening may protrude from a portion of the IT rack. The portion of the IT rack may be one of a back portion of the rack, a side portion of the rack and a top of the rack.

In further embodiments, the busway and the rack may be held flush using one or more clamps.

In still further embodiments, the IT rack may be a mobile IT rack and may be configured to be moved into a position to connect the bus plugs to the plug in stabs on the busway. The mobile IT rack may have wheels that enable the IT rack to be moved.

In some embodiments, the bus plug may be mounted on an inside or an outside surface of the rack and the bus plug may include one of a breaker/switch to electrically disconnect the bus plug from the busway. The breaker/switch may be positioned to be accessible to a technician to disconnect the power.

BRIEF DESCRIPTION OF THE DRAWINGS

FIG. 3A is a block diagram illustrating data racks coupled to the busway using the plug in stabs in accordance with some embodiments of the present inventive concept.

FIG. 3B is a cross section along the line A-A' of the diagram of FIG. 3A in accordance with some embodiments of the present inventive concept.

FIG. 4 is a block diagram illustrating as side view of a bus way connected to an IT rack using a plug in accordance with some embodiments of the present inventive concept.

DETAILED DESCRIPTION OF EMBODIMENTS

Figure 1:
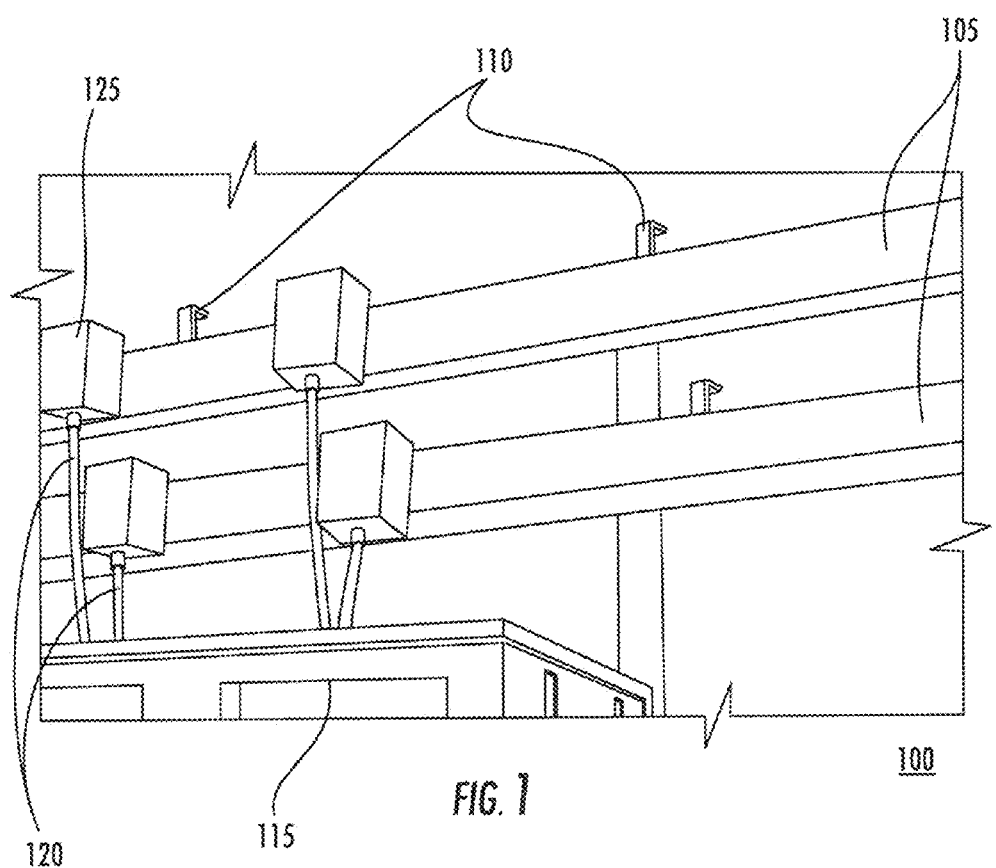
FIG. 1 is a block diagram illustrating a conventional data center including busways, receptacles and data racks.

The inventive concept now will be described more fully hereinafter with reference to the accompanying drawings, in which illustrative embodiments of the inventive concept are shown. In the drawings, the relative sizes of regions or features may be exaggerated for clarity. This inventive concept may, however, be embodied in many different forms and should not be construed as limited to the embodiments set forth herein; rather, these embodiments are provided so that this disclosure will be thorough and complete, and will fully convey the scope of the inventive concept to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As discussed above, information technology (IT) racks with provision to mount electronic chassis are commonly used in telecommunications and computer networking applications. A typical data center, for example, may include multiple racks in which equipment chassis, e.g., servers, storage units, power supplies, and the like, are inserted and mounted. Power may be provided to the equipment installed in the racks using, for example, busways. Busways are used to distribute power to the equipment in the racks. Busways typically run above or below a row of IT racks and may be configured to receive a plurality of bus plugs that include either a breaker or a switch. The bus plugs are configured to connect to the equipment in the IT racks and provide power from the busway. Typically, a receptacle mounted on a cord or fixed to the side of the bus plug is connected to a corresponding cord from equipment in the IT rack. The cords and receptacles may be difficult to install and typically cost more than the remaining portion of the bus plugs.

Accordingly, some embodiments discussed herein provide a bus plug that is integrated with the IT racks, which may eliminate the need for receptacles and/or cables associated therewith. Thus, the plug in stab integrated with an enclosure in a data center rack may plug directly into the busway without any cords therebetween, which may reduce cost as well as clutter in the data center as will be discussed further below with respect to FIGS. 2A through 3B herein.

Figure 2A:
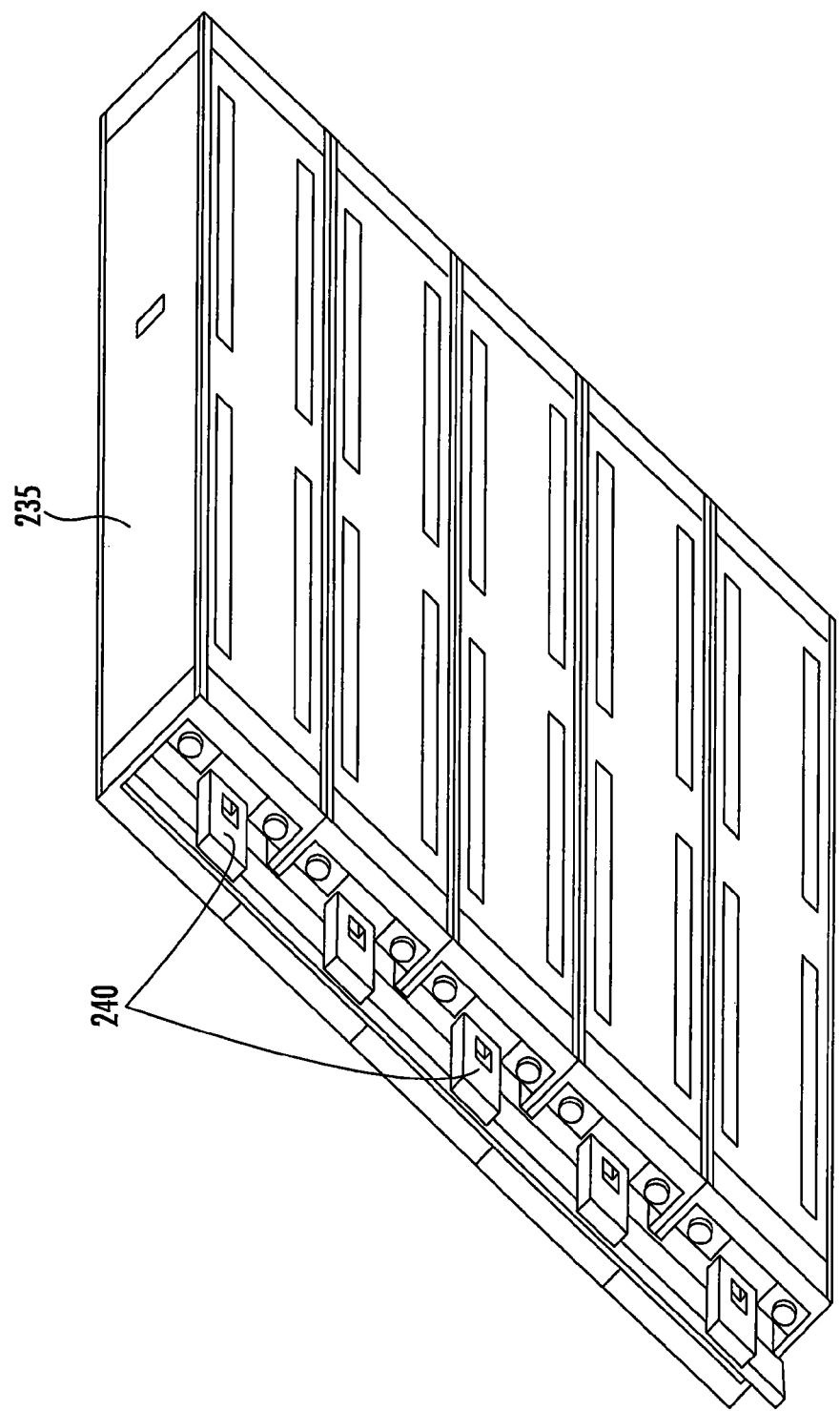
FIG. 2A is a block diagram illustrating data rack enclosures including bus plugs integrated with data racks in accordance with some embodiments of the present inventive concept.
Figure 2B:
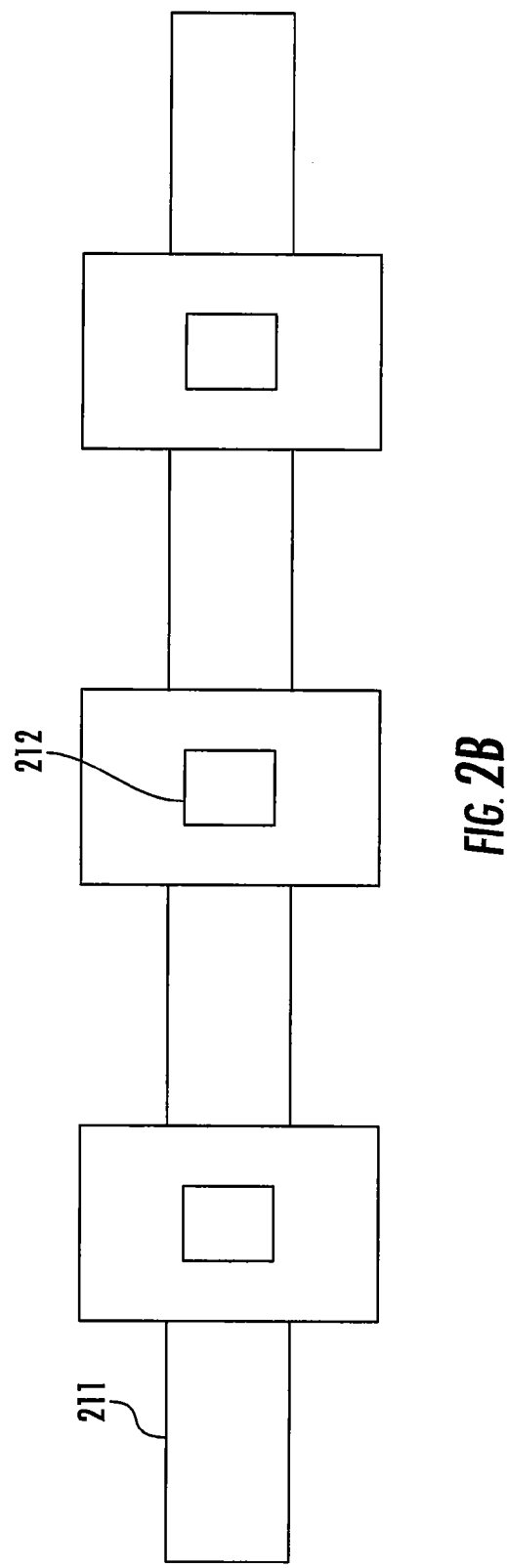
FIG. 2B is a block diagram of a busway including openings to receive bus plugs in accordance with some embodiments of the present inventive concept.

Referring now to FIG. 2A, a block diagram of a system including integrated bus plugs (plug in stabs) in accordance with some embodiments of the present inventive concept will be discussed. As illustrated in FIG. 2A, the system includes a plurality of enclosures 235. The enclosures 235 may be positioned in an IT rack and may include various types of equipment, for example, servers, storage units, power supplies and the like. As illustrated in FIG. 2A, bus plugs 240 are mounted to each of the enclosures 235. The bus plug (or stab) 240 protrudes from a surface of the enclosure 235 and is configured to connect to the busway 211 by way of plug-in openings (female connectors) 212 on the busway 211 as illustrated in FIG. 2B. The openings 212 in the receptacles on the busway may be spaced at a same distance apart as a width of the computer racks as further illustrated in FIG. 3A.

In some embodiments, the enclosures 235 (IT data rack) may include a power strip therein or connected thereto. The busway provides power to the power strip, which in turn provides power to the equipment in the enclosures 235 in the IT data rack.

Referring now to FIG. 3A, a top view of a data rack system including both the busway and the data rack connected by bus plugs in accordance with some embodiments of the present inventive concept will be discussed. As illustrated in FIG. 3A, the system includes a plurality of data racks 355 including a plurality of enclosures 335 and a busway 311 connected thereto. The enclosures 235 illustrated in FIG. 3A include a plurality of bus bars 370 therein to facilitate the connection of various devices. Although FIG. 3A illustrates four bus bars in the enclosure, embodiments of the present inventive concept are not limited to this configuration. More or less than four bus bars may be provided without departing from the scope of the present inventive concept.

As discussed above, the plurality of enclosures 335 in the data rack 355 have an integrated bus plug (240 FIG. 2A) mounted thereto that acts as a plug in stab discussed above with respect to FIG. 2A. As further illustrated in FIG. 3A, the plug in stab 240 is engaged with the busway 311 via openings (212). Thus, as illustrated in FIG. 3A, the rack system 355 and the busway 311 are connected relatively flush with no wires or receptacles needed beyond the stab connection (FIG. 4, busway 411 connected flush to rack 455 via plug 440). FIG. 3B is a cross section of the IT rack system illustrated in FIG. 3A. In some embodiments, once the stab 240 is positioned in the opening 212, clamps may be used to secure the connection (FIG. 4, clamps 490).

Although embodiments of the present inventive concept are illustrated as having a male connector (stab) associated with the rack portion of the system and a female connector (opening) associated with the busway portion of the system, it will be understood that embodiments of the present inventive concept are not limited to this configuration. For example, the stab portion (male connector) may be associated with the busway and be configured to be received by a female connector associated with the IT racks without departing from the scope of the present inventive concept.

In some embodiments, the busway 311 may be stationary, for example, may be hanging from traditional busway hangers mounted to a ceiling in the room as illustrated in FIG. 1 (110). The IT racks 355 could be configured to move i.e. may be mounted on wheels (495 of FIG. 4), which would allow the IT racks 355 to be positioned to connect to the stationary busway. In some embodiments, angled hangers may be used to keep the busway 311 from swinging away from the IT rack 355 as it is being connected to the IT rack 355. It will be understood that data racks 355 may be newly designed or retrofitted in accordance with embodiments of the present inventive concept.

As further illustrated in FIG. 3A, in some embodiments, each connection has an associated disconnecting means 375, for example, a breaker or fusible switch. As shown, the disconnecting means 375 can be mounted to a portion of the system, for example, busway receptacle/enclosure, and may protrude forward or upward from the enclosure to ensure easy access.

As discussed above, some embodiments of the present inventive concept provide a bus plug integrated with an IT rack that is configured to connect to an opening in a busway without the use of external wires and the like. Use of embodiments of the present inventive concept may decrease a total required number of connections because only one connection is needed to replace the two needed when a wire was used.

In the drawings and specification, there have been disclosed exemplary embodiments of the inventive concept. Although specific terms are employed, they are used in a generic and descriptive sense only and not for purposes of limitation, the scope of the inventive concept being defined by the following claims.

That which is claimed:

1. A busway for power distribution to equipment positioned in an information technology (IT) rack, the busway comprising:
    a plurality of openings in a receptacle on a first surface of the busway, the plurality of openings in the receptacle in the busway being configured to receive a plurality of plug-in stabs that protrude from an external surface of the IT rack and are associated with a plurality of bus plugs integrated with the IT rack,
    wherein the busway is external to the IT rack such that when the plurality of plug-in stabs are positioned in the plurality of openings in the busway, the external surface of the IT rack is adjacent and held flush with the first surface of the busway and power is provided to the IT rack from the busway via the plurality of plug-in stabs without cords.

2. The busway of claim 1, wherein when the plurality of plug-in stabs are positioned in the plurality of openings in the busway no cords are used to connect the busway to the bus plugs integrated with the IT rack.

3. The busway of claim 1, wherein a spacing between the plurality of openings on the busway is relative to a width of the IT rack and the spacing comprises a same distance as the width of the IT rack.

4. The busway of claim 1, wherein a portion of the IT rack comprising the external surface is one of a back portion of the IT rack, a side portion of the IT rack and a top of the IT rack.

5. The busway of claim 4, wherein the first surface of the busway and the external surface of the IT rack are held flush using one or more clamps.

6. The busway of claim 1, wherein the IT rack is a mobile IT rack and is configured to be moved to connect the bus plugs to the plug in stabs on the busway.

7. The busway of claim 6, wherein the mobile IT rack has wheels that allow the IT rack to be moved.

8. A busway for power distribution to equipment positioned in an information technology (IT) rack, the busway comprising:
    a plurality of openings in a receptacle on a first surface of the busway, the plurality of openings in the receptacle in the busway being configured to receive a plurality of plug-in stabs that protrude from an external surface of the IT rack and are associated with a plurality of bus plugs integrated with the IT rack,
    wherein the busway is external to the IT rack such that when the plurality of plug-in stabs are positioned in the plurality of openings in the busway, the external surface of the IT rack is adjacent the first surface of the busway and power is provided to the IT rack from the busway via the plurality of plug-in stabs without cords,
    wherein the bus plugs are mounted on an inside of the external surface of the IT rack, and wherein the plug-in stabs respectively include a breaker or switch that is external to and adjacent the external surface of the IT rack to electrically disconnect the bus plugs from the busway.

9. The busway of claim 8, wherein the breaker or switch is positioned on the plug-in stab to be accessible to a technician to disconnect the power.

10. An information technology (IT) enclosure configured to be positioned in an IT rack, the IT enclosure comprising:
    an integrated plug-in stab associated with a bus plug, the integrated plug-in stab configured to be received in an opening in a receptacle on a first surface of a busway that is external to the IT rack such that, when the IT enclosure is positioned in the IT rack and the integrated plug-in stab is positioned in the opening in the busway, the integrated plug-in stab protrudes from an external surface of the IT rack, the external surface of the IT rack is adjacent and held flush with the first surface of the busway, and power is provided to the IT rack from the busway via the integrated plug-in stab without cords.

11. The IT enclosure of claim 10, wherein when the integrated plug-in stab is positioned in the opening in the busway no cords are used to connect the busway to the bus plug integrated with the IT rack.

12. The IT enclosure of claim 10, wherein a portion of the IT rack comprising the external surface is one of a back portion of the IT rack, a side portion of the IT rack and a top of the IT rack.

13. The IT enclosure of claim 12, wherein the first surface of the busway and the external surface of the IT rack are held flush using one or more clamps.

14. The IT enclosure of claim 10, wherein the IT rack is a mobile IT rack and is configured to be moved to connect the bus plugs to the plug in stabs on the busway.

15. The IT enclosure of claim 14, wherein the mobile IT rack has wheels that allow the IT rack to be moved.

16. An information technology (IT) enclosure configured to be positioned in an IT rack, the IT enclosure comprising:
    an integrated plug-in stab associated with a bus plug, the integrated plug-in stab configured to be received in an opening in a receptacle on a first surface of a busway that is external to the IT rack such that, when the IT enclosure is positioned in the IT rack and the integrated plug-in stab is positioned in the opening in the busway, the integrated plug-in stab protrudes from an external surface of the IT rack, the external surface of the IT rack is adjacent the first surface of the busway, and power is provided to the IT rack from the busway via the integrated plug-in stab without cords, wherein the bus plug is mounted on an inside or an outside surface of the IT enclosure, and wherein the integrated plug-in stab includes a breaker or switch that is external of and adjacent the external surface of the IT rack to electrically disconnect the bus plug from the busway.

17. The IT enclosure of claim 16, wherein the breaker or switch is positioned on the integrated plug-in stab to be accessible to a technician to disconnect the power.

18. An information technology (IT) enclosure configured to be positioned in an IT rack, the IT enclosure comprising:

a bus plug mounted in or on the IT enclosure; and an integrated plug-in stab associated with the bus plug and configured to be received in an opening in a first surface of a busway that is external to the IT rack, wherein the integrated plug-in stab is configured to protrude from an external surface of the IT rack and is configured to be positioned in the opening in the first surface of the busway such that the external surface of the IT rack is adjacent the first surface of the busway and such that power is provided to the IT rack from the busway via the integrated plug-in stab, and wherein the integrated plug-in stab comprises a breaker or switch that is external of and adjacent the external surface of the IT rack, and wherein the breaker or switch is operable to electrically disconnect the bus plug from the busway.

\* \* \* \* \*